United States Patent [19]
Keller

[11] 3,985,947
[45] Oct. 12, 1976

[54] DEVICE AND METHOD FOR CRUCIBLE-FREE ZONE MELTING OF CRYSTALLIZABLE RODS IN PARTICULAR SEMICONDUCTOR RODS

[75] Inventor: Wolfgang Keller, Munich, Germany

[73] Assignee: Siemens Aktiengesellschaft, Berlin & Munich, Germany

[22] Filed: Apr. 30, 1975

[21] Appl. No.: 572,966

[30] Foreign Application Priority Data
May 27, 1974 Germany............................ 2425468

[52] U.S. Cl............................... 13/26; 13/DIG. 1; 156/620; 219/10.75
[51] Int. Cl.²............................................. H05B 5/00
[58] Field of Search................... 13/26, 34, DIG. 1; 174/15 C; 219/10.43, 10.75; 156/620

[56] References Cited
UNITED STATES PATENTS
3,270,177  8/1966  Prediger et al. ............ 219/10.75
3,377,565  4/1968  Denner......................... 219/10.75

FOREIGN PATENTS OR APPLICATIONS
21,938  9/1961  Germany............................ 174/15 C Primary Examiner—Harry Moose
Attorney, Agent, or Firm—Hill, Gross, Simpson, Van Santen, Steadman, Chiara & Simpson

[57] ABSTRACT

A device for crucible free zone melting on crystallizable rods, in particular on semiconductor rods, in which the molten zone is produced in the rod which is to be treated, by the electromagnetic field of an induction heating coil which surrounds the rod in annular fashion and at a distance, in which the induction heating coil is supplemented by a parallel-connected capacitor to form an electric heating oscillatory circuit, and in which the oscillatory heating circuit is fed via a high frequency line and at least one adjustable coupling element by a high frequency generator which supplies an a.c. voltage of adjustable frequency. Circuit components are provided between the output of the high frequency generator and the electric heating oscillatory circuit which contains the induction heating coil; at least the high frequency line of such components is equipped with a channel which conducts a flowing coolant.

9 Claims, 3 Drawing Figures

DEVICE AND METHOD FOR CRUCIBLE-FREE ZONE MELTING OF CRYSTALLIZABLE RODS IN PARTICULAR SEMICONDUCTOR RODS

BACKGROUND OF THE INVENTION

1. Field of the Invention

This invention relates to a device for crucible-free zone melting on crystalline rods, in particular semiconductor rods, in which the molten zone is produced in the rod which is to be treated by the electromagnetic field of an induction heating coil which surrounds the rod (the rod being supported at its ends) in annular fashion and at a distance, in which the induction heating coil is supplemented by a capacitor connected in parallel to the latter, to form an electric oscillatory heating circuit, and the oscillatory heating circuit is fed via a high-frequency line and at least one adjustable coupling element by a high frequency generator which supplies an a.c. voltage of adjustable frequency.

2. Description of the Prior Art

Such a device is described in the British Letters Patent No. 1,144,907. The high frequency generator of the arrangement is provided with a constantly variable output frequency and possesses an electric oscillatory circuit (also referred to herein as a tank circuit) in the output, having an inductance which is provided with a displaceable tapping which is connected to the oscillatory heating circuit via a coupling inductance or a coupling capacitor. The electrical power provided to the oscillatory heating circuit, and via the latter to the rod which is to be zone melted, is preferably set via the frequency of the a.c. voltage emitted from the high frequency generator. This a.c. voltage is selected to be such that in normal operation it differs relatively little from the characteristic frequency of the oscillatory heating circuit. Therefore, it is ensured that in view of the properties of the transmission elements employed, an optimum energy transfer to the crystalline rod which is to be treated, in particular the silicon rod, is achieved when the amplitude of the a.c. voltage occurring in the induction heating coil differs from the amplitude in the case of resonance by approximately 10 percent.

A further possibility of influencing the electric active power transmitted to the oscillatory heating circuit and to the rod which is to be zone melted is that of adjusting the variable coupling of the oscillatory heating circuit to the output of the high frequency generator.

The setting of the generator frequency and the coupling of the oscillatory heating circuit to the output of the high frequency generator are matters of experiment which must be made for specific rod diameters of a certain crystalline material, e.g. silicon. One thus easily achieves the aim of providing crucible-free zone melting of homogeneous rods. If, however, crucible-free zone melting is used for the treatment of rods having inhomogeneous diameters and/or inhomogeneous material properties, the prior art suggests that the only course that can be taken is to vary the setting of the generator output frequency and/or of the degree of coupling during the zone melting. However, this technique is not favorable in respect of the mechanically labile state of the molten zone, as undesired changes in the molten zone easily can occur, or the molten zone can even start to drip.

In particular, in the zone melting of silicon rods whose diameters are greater than 50 mm. the load zone, which must pass over the melting of the monocrystalline seed (which is required for the monocrystalline growth of the silicon crystallizing out of the molten zone) to the rod zone which is to be connected to the seed via a bottle neck and adjoining cone, and which has a normal, i.e. a considerably larger rod diameter, is very large. This might result in the aim of discovering generator frequency settings and/or coupling settings which can be used for a series of transition stages of the molten zone which can be used without damaging the molten zone, which in this state is particularly sensitive.

SUMMARY OF THE INVENTION

In view of the above, it would therefore be much more favorable and advantageous to be able to achieve the aim without readjusting the generator frequency and/or the degree of coupling, and the primary object of the invention is to provide a device which enables this to be done.

A device constructed in accordance with the invention for crucible-free zone melting on crystallizable rods, in particular semiconductor rods, is characterized in that of the circuit components provided between the output of the high frequency generator and the electric oscillatory heating circuit which contains the induction heating coil, at least the high frequency line is equipped with a channel which conducts a flowing coolant.

Due to the intensive cooling of the circuit components which serve to transmit energy from the high frequency generator to the oscillatory heating circuit, it is not necessary that one be concerned with the greatly varying losses in these (sensitive) circuit components which are due to the differing coupling (mutual inductance) of the rod which is to be zone melted to the induction heating coil, so that the molten zone can be moved with a setting of generator frequency and coupling of the oscillatory heating circuit which is permanently adapted in particular to the normal rod diameter even in the case of substantially differing diameters of the rod.

BRIEF DESCRIPTION OF THE DRAWINGS

Other objects, features and advantages of the invention will be best understood from the following description, taken in conjunction with the accompanying drawing, on which.

It should be noted that it is also possible to cool the elements of the heating oscillatory circuit and/or the output circuit of the high frequency generator.

DESCRIPTION OF THE PREFERRED EMBODIMENT

Figure 1:
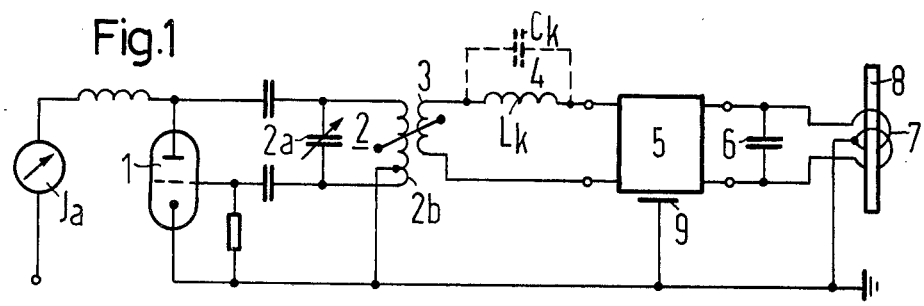
FIG. 1 represents an example of an electric circuit on which the device of the invention is to be based.

Referring to FIG. 1, the output 2 of a high frequency generator 1 of known construction is in the form of an oscillatory circuit facilitating a variable setting of the output frequency. In the example illustrated, a Hartley-type oscillator circuit has been used in which the anode current $J_a$ may be read off with the aid of an instrument provided between anode and cathode of the generator electron tube 1. The output frequency is set via a capacitor 2a, which provided an adjustable capacitance for the output oscillatory circuit 2. The coupling of the oscillatory heating circuit formed from an induction heating coil 7 and a capacitor 6 connected in parallel to the coil 7 is effected via a high frequency line 5, an inductive or capacitive coupling element which passes a wide frequency band, and via an output coupling coil 3 which itself, with an induction coil 2b of the output oscillatory circuit 2 of the high frequency generator 1, forms a transformer with a variable degree of coupling.

The semiconductor rod 8, in particular a silicon rod, which is to be zone melted is surrounded by the induction heating coil 7 in annular fashion, in particular coaxially, and is freely supported in known manner at its ends in a vertical position within a zone melting vessel. Neither the zone melting vessel nor the rod holders have been represented as the invention is not concerned with the design of these generally known components.

At the start of the crucible-free zone melting of the production of monocrystalline, non-dislocated silicon rods, the first molten zone, as already mentioned, is produced at the boundary between a monocrystalline seed and the silicon rod which is to be transformed into a monocrystal. Usually the diameter of the seed crystal is a multiple smaller than that of the rod which is to be melted. Therefore, a gradual transition of the diameter of the molten zone from that of the seed crystal to that of the rod which is to be melted is provided which, to facilitate the latter, is provided with a conical constriction at the end which is to be melted first, in particular the lower end. As the diameter of the induction heating coil 7 remains unchanged, there is a considerable alteration in the mutual inductance between the heating coil 7 and the silicon rod during the displacement of the molten zone from the boundary to the seed crystal into the silicon rod which is to be melted. (As will easily be realized and readily appreciated, the mutual inductance and the coupling of the rod 8 to the induction heating coil 7 increase with increasing diameter of the rod 8). This results in substantial changes in the current I produced in the molten zone, as will be seen from the following approximated equation:

$$I = \frac{-i\omega M \cdot U}{-\omega^2 M^2 + (R_1 + i\omega L_1)(R_2 + i\omega L_2 - \frac{i}{\omega C_2})},$$

which applies to the situation of two circuits coupled purely inductively and traversed by alternating current, where the capacitance of the one circuit is negligible. (In this formula $M$ is the mutual inductance between the rod, thus the molten zone, and the induction heating coil $R_1$ is the resistance of the molten zone, $L_1$ is the self-inductance of the molten zone, $R_2$ is the overall resistance of the transmission elements located between the exciting emf, thus the high frequency generator 1 and the rod 8, $L_2$ is the overall self-inductance, $C_2$ is the overall capacitance of these elements, $U=U_0 e^{i\omega t}$ is the high frequency voltage supplied by the generator 1, and $\omega$ is the cyclic frequency, while $i$ and $e$ have their normal mathematical significance. A similar or more complicated equation also applies to the active power which is converted in the molten zone.

Not only the current in the molten zone but also the current in the transmission elements and the power converted therein are also dependent upon the parameters $M$, $L_1$ and $R_1$. Here again, the conditions are somewhat more complicated than the above equation and therefore they have not been represented. In this case it should be noted that the losses in the transmission elements, thus above all in the high frequency line 5 increase in proportion to the reduction in the value of $M$.

To avoid this, by constantly readjusting the output coupling of the oscillating heating circuit, it may be ensured that an optimum operative point, in particular on the capacitive side of the heating oscillating circuit is ensured at every instant of the process in such manner that the excess heat development in the transmission elements, above all in the high frequency line 5, is decelerated. On the other hand, however, it has proved that such a readjustment of the coupling is complicated and not harmless for the mechanical stability of the molten zone.

Therefore, the invention proposes that at a given frequency range of the generator 1, the setting of the coupling elements 3 and 4 is contrived to be such that optimum transmission with minimal heat-development occurs in the transmission elements 3, 4 and 5 when the molten zone moves to points of the silicon rod at which the latter has its normal diameter. This setting is, however, to be maintained even when the molten zone is moved to points having a different diameter, in particular to the junction between the seed crystal and the normal rod. In order to render harmless the heat which is then developed to a particularly great extent in the circuit component 5 and possibly also in the components 4 and 3, during the operation of the arrangement in accordance with the invention the circuit components which serve to effect this energy transfer are effectively cooled.

Figure 2:
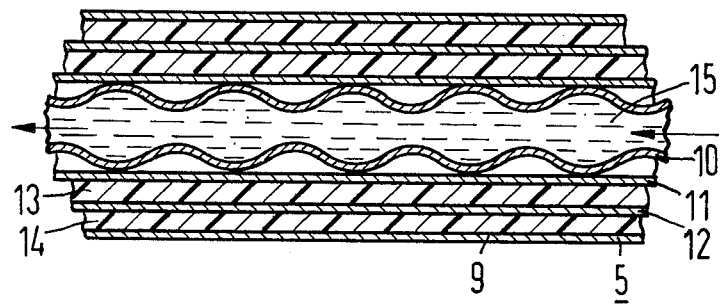
FIG. 2 shows a particularly advantageous design of a high frequency line constructed according to the invention.

A high frequency cable which is suitable for the device of the invention for crucible-free zone melting will be described making reference to FIG. 2. Its length is substantially shorter than a quarter of the wave length of the electrical oscillations produced by the generator 1.

The core of the cable 5, which is of coaxial construction, is formed by a cooling tube 10 which is in the form of a corrugated tube and consists of an elastic, non-ferromagnetic metal, such as for example, a copper alloy such as tombac. The corrugation of the tube 10, its diameter, and its wall thickness are selected to be such that adequate pliability of the tube is ensured. For example, the wall thickness amounts to 0.1 – 0.2 mm, the distance between adjacent crests and troughs of the corrugation are 0.5 cm and the diameter is 1.2 cm. A stocking-like mesh consisting of fine copper wires (which may possibly be silver-plated) is pulled tightly onto this cooling tube 10, so that the mesh 11 which forms the inner conductor of the cable 5 is held on the crests of the corrugated tube 10 in direct heat conducting contact with the corrugated tube 10 which is traversed by a coolant 15. The layer 13 between the inner conductor 11 and the outer conductor 12 which is arranged concentrically to the latter and likewise consists of a fine copper mesh, and likewise the insulating layer 14 which cover the outer conductor 12, consist for example of polytetrafluoroethylene or polyethylene or polystyrene, or of another low-loss synthetic resin material. It can be applied in the form of thin wound-on strips. The dimensioning of the conductors and insulating layers of the cable 5 is to also ensure the required pliability. Therefore, the insulating layers 13 and 14 are provided with wall thicknesses of approximately 0.3 –

0.6 cm. The cable 5 is finally provided on its outside with a screen 9 which must be grounded, and is in the form of a metallization or a metal mesh.

In operation, the corrugated tube 10 is traversed by a liquid or gaseous coolant 15. This can, for example, be cooling water which is supplied by a waterpipe line or a pump. Possibly, it may be expedient to use a cooling gas which is supplied by a refrigeration machine.

Figure 3:
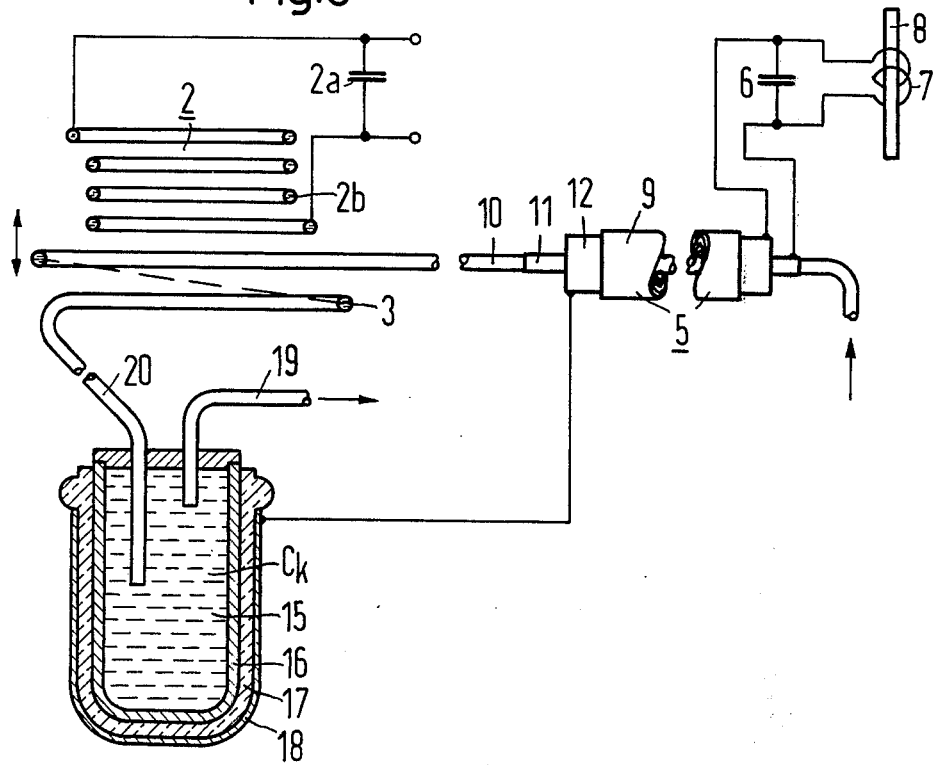
FIG. 3 shows a particularly advantageous arrangement of the cooling of the coupling elements provided between the generator output and the oscillatory heating circuit.

While the main part of the developed heat losses occur in the high frequency cable 5, a considerable heat development may also be expected in the output coupling coil and in the coupling element 4 when the diameter of the molten zone differs from its normal value. These elements are also cooled, although not so critically as in the cable 5. Here, the use of a cooling channel common to all the elements is proposed, possibly in the form illustrated in FIG. 3.

The coupling element 4 consists of an induction coil $L_k$ if the operating state of the arrangement is to correspond to an operative point $\omega$ on the inductive side of the resonance curve, or of a capacitance if the operating state is to correspond to an operative point $\omega$ on the capacitance side of the resonance curve. As the second case is to be preferred, in FIG. 3, the coupling element 4 is represented by a coupling capacitor $C_k$. The letter is, for example, in the form of a voltage-resistant ceramic coaxial capacitor.

The inner conductor 16 of the coupling capacitor $C_k$ at the same time forms the walls of the container which is traversed by the cooling medium 15 and is separated by a thin layer 17 of dielectric material, in particular ceramic material from the outer conductor 18 of the capacitor. Here again, a low-loss dielectric material is expedient. The cooling agent 15 is conducted to the cooling container of the capacitor $C_k$ through a tube 20 and is discharged via a tube 19.

The output coupling coil 3 is connected in series with respect to the flow of coolant 15 and electrically via the tube 20 which consists of conductive material and the inner conductor 16 of $C_k$. The second electrode 18 of $C_k$ is connected to the one conductor, in the example of the outer conductor 12 of the high frequency cable 5. The output coupling coil 3 which consists of a wound copper tube is connected in series both electrically and in respect of the cooling flow, to the inner conductor, formed from the corrugated tube 10 and the metal stocking 11, of the cable 5. Therefore, the connection tubes which conduct the coolant consist of good conductive metal, e.g. copper.

The corrugated tube 10 of the cable 5 obtains a supply of cool coolant at the end facing away from the coupling coil 3. The coolant can possibly flow via the capacitor 6 of the oscillatory heating circuit, which then is of similar design to the capacitor $C_k$, and is connected via a further tube consisting of conductive metal to the end of the corrugated tube 10 facing away from the output coupling coil 3. If a coupling inductance $L_k$ is used instead of a coupling capacitor for the coupling element 4, the inductance can, similarly to the output coupling coil 3 be in the form of a wound tube traversed by the coolant 15. However, in contrast to the output coupling coil 3, the inductance is not coupled to the oscillatory circuit coil 2b of the generator 1.

The output coupling coil 3 is, for example, arranged coaxially to the oscillatory circuit coil 2b at the output of the generator 1 and can be axially displaced. By this means the coupling between the output coupling coil 3 and the oscillating circuit coil 2b and thus the coupling of the oscillatory heating circuit containing the induction heating coil 7 to the high frequency generator is adjusted in determinate manner.

The range of the output frequency of the generator 1 and the position of the output coupling coil 3 are preferably set to be such that the anode d.c. current $J_a$ of the output tube in the generator 1 is approximately 10 – 20 percent less than the maximum value if the molten zone in the silicon rod 8 is fully formed in a rod component possessing the normal diameter. This setting is a matter of experiment and can easily be determined by a few trails and transferred to similar conditions. Should the molten zone differ from the normal conditions it is no longer necessary to vary the output coupling since through the use of the device in accordance with the invention the components which become greatly heated in operation are effectively protected from overheating.

Although I have described my invention by reference to particular illustrative embodiments thereof, many changes and modifications may become apparent to those skilled in the art without departing from the spirit and scope of the invention. I therefore intend to include in the patent warranted hereon, all such changes and modifications as may reasonably and properly be included within the scope of my contribution to the art.

I claim:

1. In a device for crucible-free zone melting of crystallizable rods, in particular semiconductor rods, in which a rod to be treated by an electromagnetic field is supported at its ends and surrounded at a distance by an annular induction heating coil which has a capacitor connected in parallel therewith to form an oscillatory heating circuit, and in which the heating circuit is fed via circuit components including a high frequency line and at least one adjustable coupling element by a high frequency generator which supplies an a.c. voltage of adjustable frequency, the improvement comprising:
a cooling channel for conducting a flow of cooling fluid in at least the high frequency line of the circuit components between the high frequency generator and the oscillatory heating circuit whereby crucible-free zone melting of said rods may be carried out without adjustments to said heating circuit in respect of different diameters of said rod.

2. In a device according to claim 1, wherein the high frequency line comprises a coaxial cable which includes a passageway along its length defining said channel.

3. In a device according to claim 1, wherein the high frequency line comprises a coaxial cable which includes a corrugated tube of non-ferromagnetic material defining said channel and a metal mesh covering and in contact with said tube, said tube and said metal mesh forming an inner conductor of said coaxial line.

4. In a device according to claim 3, wherein said corrugated tube is constructed of an alloy of copper.

5. In a device according to claim 4, wherein said alloy is tombac.

6. In a device according to claim 1, wherein the coupling element also comprises a cooling channel connected to receive a flow of coolant.

7. In a device according to claim 6, wherein the cooling channels of the high frequency line and the coupling element are connected in series in respect of a flow of cooling fluid.

8. In a method for crucible-free zone melting of a crystallizable rod, in particular a semiconductor rod, wherein an induction heating coil of an oscillatory heating circuit is inductively coupled to a rod and fed by a high frequency generator via coupling elements, the improvement comprising the steps of:
  adjusting the power transmission to the heating circuit, at a given output frequency of the high frequency generator, to provide sufficient power transmission to sustain melting at a maximum diameter of the rod;
  maintaining the adjusted power transmission constant in respect of different diameters of the rod; and cooling at least one of the coupling elements to dissipate heat increases therein due to heating the rod at diameters less than the maximum diameter.

9. In an apparatus for crucible-free zone melting of a crystalline rod, in particular a semiconductor rod, of the type wherein an induction heating coil of an oscillatory heating circuit is inductively coupled to a rod and fed by a high frequency generator via coupling elements, the improvement comprising:
  means for adjusting the power transmission to the heating circuit, at a given output frequency of the high frequency generator, to provide sufficient power transmission to sustain melting at a maximum diameter of the rod;
  means for maintaining the adjusted power transmission constant in respect of different diameters of the rod; and means for cooling at least one of the coupling elements to dissipate heat increases therein due to heating the rod at diameters less than the maximum diameter.

* * * * *